United States Patent
Fujisawa et al.

(10) Patent No.: US 7,815,095 B2
(45) Date of Patent: Oct. 19, 2010

(54) WIRE LOOP, SEMICONDUCTOR DEVICE HAVING SAME AND WIRE BONDING METHOD

(75) Inventors: Hiromi Fujisawa, Tokyo (JP); Masaru Ishibashi, Tokyo (JP); Rei Imai, Tokyo (JP)

(73) Assignee: Kaijo Corporation, Tokyo (JP)

( * ) Notice: Subject to any disclaimer, the term of this patent is extended or adjusted under 35 U.S.C. 154(b) by 383 days.

(21) Appl. No.: 11/325,166

(22) Filed: Jan. 4, 2006

(65) Prior Publication Data

US 2006/0151579 A1 Jul. 13, 2006

(30) Foreign Application Priority Data

Jan. 11, 2005 (JP) .............................. 2005-003488

(51) Int. Cl.
*B23K 31/00* (2006.01)
(52) U.S. Cl. ...................... 228/180.5; 228/4.5; 438/617
(58) Field of Classification Search ............... 228/180.5
See application file for complete search history.

(56) References Cited

U.S. PATENT DOCUMENTS

| | | | |
|---|---|---|---|
| 4,327,860 A * | 5/1982 | Kirshenboin et al. | 228/180.5 |
| 5,961,029 A | 10/1999 | Nishiura et al. | |
| 5,989,995 A * | 11/1999 | Nishiura et al. | 438/617 |
| 6,112,974 A * | 9/2000 | Nishiura et al. | 228/180.5 |
| 6,213,378 B1 * | 4/2001 | Singh | 228/110.1 |
| 6,232,211 B1 | 5/2001 | Tsukahara | |
| 6,774,494 B2 | 8/2004 | Arakawa | |
| 6,901,305 B2 | 5/2005 | Kimura et al. | |
| 6,933,608 B2 | 8/2005 | Fujisawa | |
| 2005/0285262 A1 | 12/2005 | Knapp et al. | |

FOREIGN PATENT DOCUMENTS

| | | |
|---|---|---|
| JP | H3-142941 | 6/1991 |
| JP | 04-273135 | 9/1992 |
| JP | 4-273135 | 9/1992 |
| JP | 06-132347 | 5/1994 |
| JP | 9-51011 | 2/1997 |
| JP | 10-199916 | 7/1998 |
| JP | 11-067808 | 9/1999 |
| JP | 2004-172477 | 6/2004 |

* cited by examiner

*Primary Examiner*—Jessica L Ward
*Assistant Examiner*—Nicholas P D'Aniello

(57) ABSTRACT

A wire loop comprises a wire connecting a first bonding point and a second bonding point therethrough, wherein the wire includes a ball bonded to the first bonding point, a neck portion adjacent to the ball and a major portion extending from the neck portion to the second bonding point. The neck portion includes a riser part which extends, from the bonded ball, obliquely upward in a direction toward the second bonding point, and the riser part is formed by a top portion of the ball which has entered an opening of a capillary and been shaped at the time of ball bonding. The riser part is formed by inclining the top portion of the ball, which enters the opening of the capillary at the time of ball bonding, which inclining is done by moving the capillary obliquely upward toward the second bonding point.

12 Claims, 10 Drawing Sheets

WIRE LOOP, SEMICONDUCTOR DEVICE HAVING SAME AND WIRE BONDING METHOD

BACKGROUND OF THE INVENTION

1. Field of the Invention

The present invention relates to a wire bonding method for connecting a first bonding point and a second bonding point through a wire, a wire loop having a certain shape and a semiconductor device having such a wire loop incorporated therein.

2. Description of the Related Art

Figure 9A:
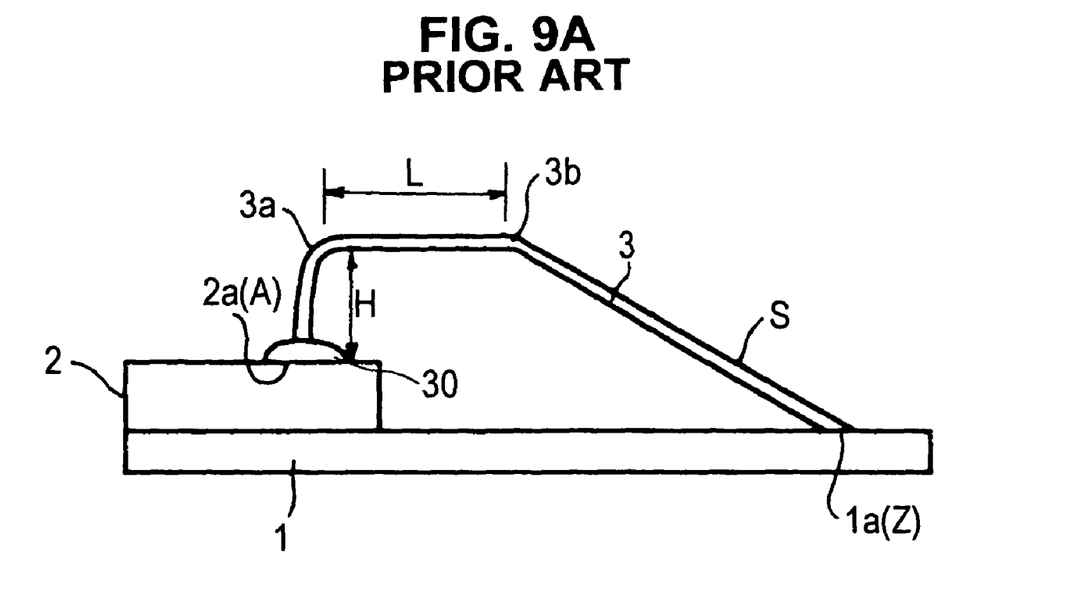
FIGS. 9A and 9B are elevational views showing conventional wire loops having a trapezoidal shape and a triangular shape, respectively.
Figure 9B:
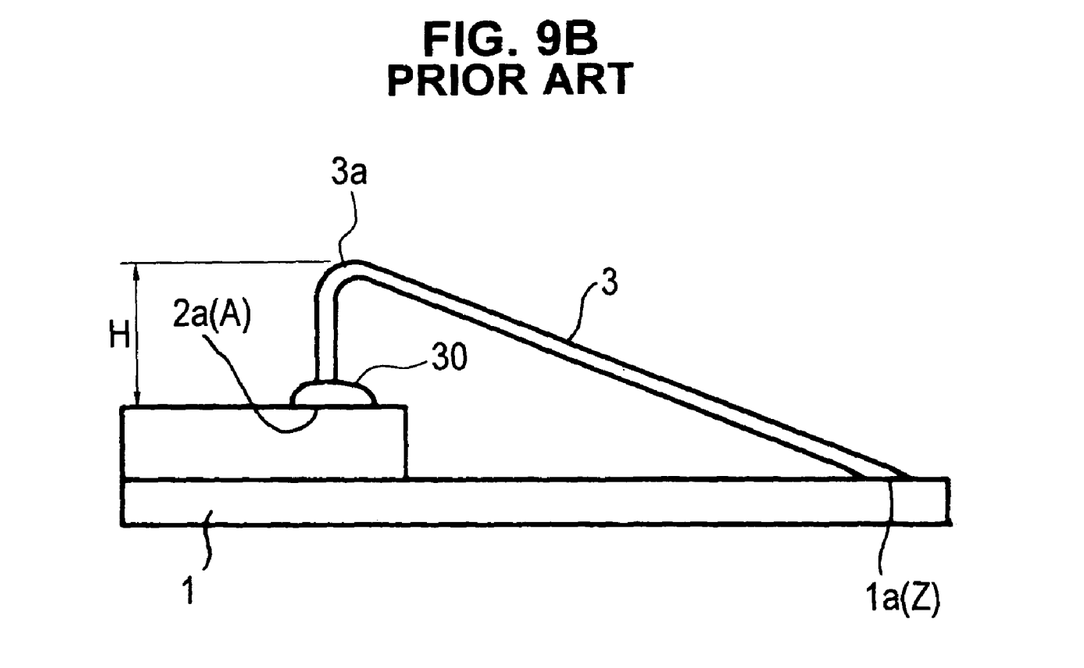

Conventionally, in a process of fabricating a semiconductor device, as shown in FIG. 9A or 9B, wire bonding for connecting a pad 2a or a first bonding point A of a semiconductor chip 2 attached to a lead frame 1 and a lead 1a or a second bonding point Z of the lead frame 1 through a wire 3 has been carried out. Typically, loop shapes of the wire 3 connecting the first and second bonding points A and Z include a trapezoidal shape and a triangular shape shown in FIGS. 9A and 9B, respectively, as disclosed, for example, in U.S. Pat. No. 6,036,080 or Japanese Patent Application Laid-Open Publication No. 2000-277558.

Figure 10:
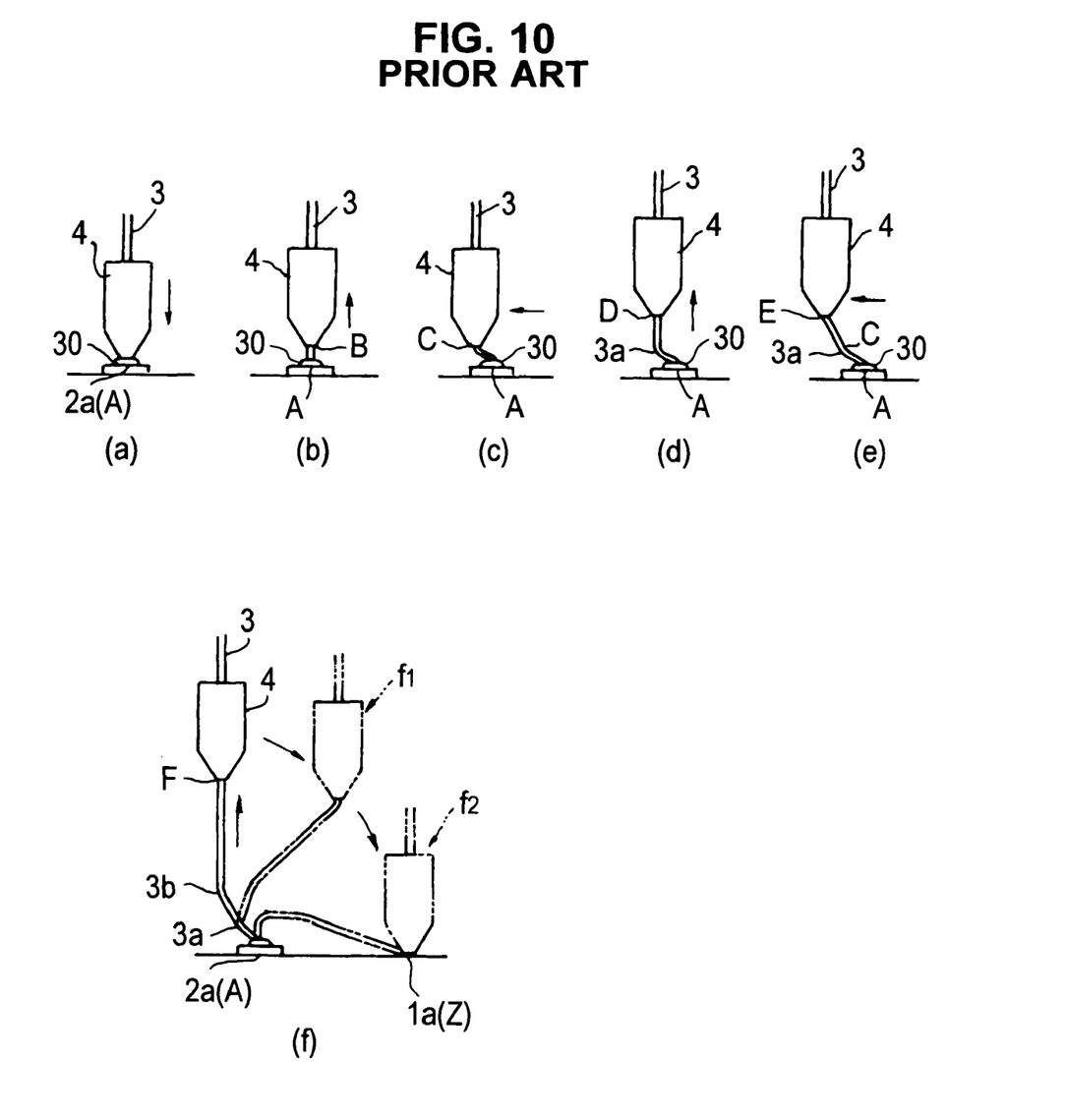
FIG. 10 is a schematic diagram showing wire shapes in respective steps in association with the movement of the capillary to form the wire loop of a trapezoidal shape shown in FIG. 9A.

The wire loop having a trapezoidal shape shown in FIG. 9A is formed by a sequence of steps as shown in FIG. 10. First, in step (a) of FIG. 10, a capillary 4 through which the wire 3 passes is lowered and a ball 30 which has been formed at a tip end of the wire 3 is bonded to the pad 2a of the chip 2 or first bonding point A. Then, in step (b) of FIG. 10, the capillary 4 is vertically raised to a point B while the wire 3 is supplied. Thereafter, in step (c) of FIG. 10, the capillary 4 is horizontally moved to a point C in a direction opposite from the second bonding point Z.

In general, such an operation of the capillary 4 to be moved in the direction opposite from the second bonding point Z is referred to as a "reverse operation". As a result, the portion of the wire 3 between the points A and C is formed to be inclined and the wire 3 is formed at an upper end of the inclined portion thereof with a bend 3a by a lower end of the capillary 4. The portion of the wire 3 between the points A and C thus supplied corresponds to the height of a neck portion H (or a portion of the wire 3 between the pad 2a and the bend 3a) and will constitute the neck portion H.

Subsequently, in step (d) of FIG. 10, the capillary 4 is vertically raised to a point D while the wire 3 is supplied. Then, in step (e) of FIG. 10, the reverse operation of the capillary 4 is performed again, i.e. the capillary 4 is horizontally moved to a point E in the direction opposite from the second bonding point Z. As the result of this reverse operation, the wire 3 has another inclined portion formed to be extending between the points C and E, and a bend 3b is formed in an upper end of this inclined portion of the wire 3.

This inclined portion of the wire 3 thus supplied will constitute an upper base portion L (or a portion of the wire 3 between the bends 3a and 3b) of the wire loop having a trapezoidal shape shown in FIG. 9A. Thereafter, in step (f) of FIG. 10, the capillary 4 is vertically raised to a point F so that the wire 3 is supplied by a length corresponding to a long inclined portion S (or a portion of the wire 3 between the bend 3b and the lead 1a) of the wire loop shown in FIG. 9A. Subsequently, the capillary 4 is lowered to the second bonding point Z via positions $f_1$ and $f_2$, so that the wire 3 is bonded to the second bonding point Z or the lead 1a.

Figure 11:
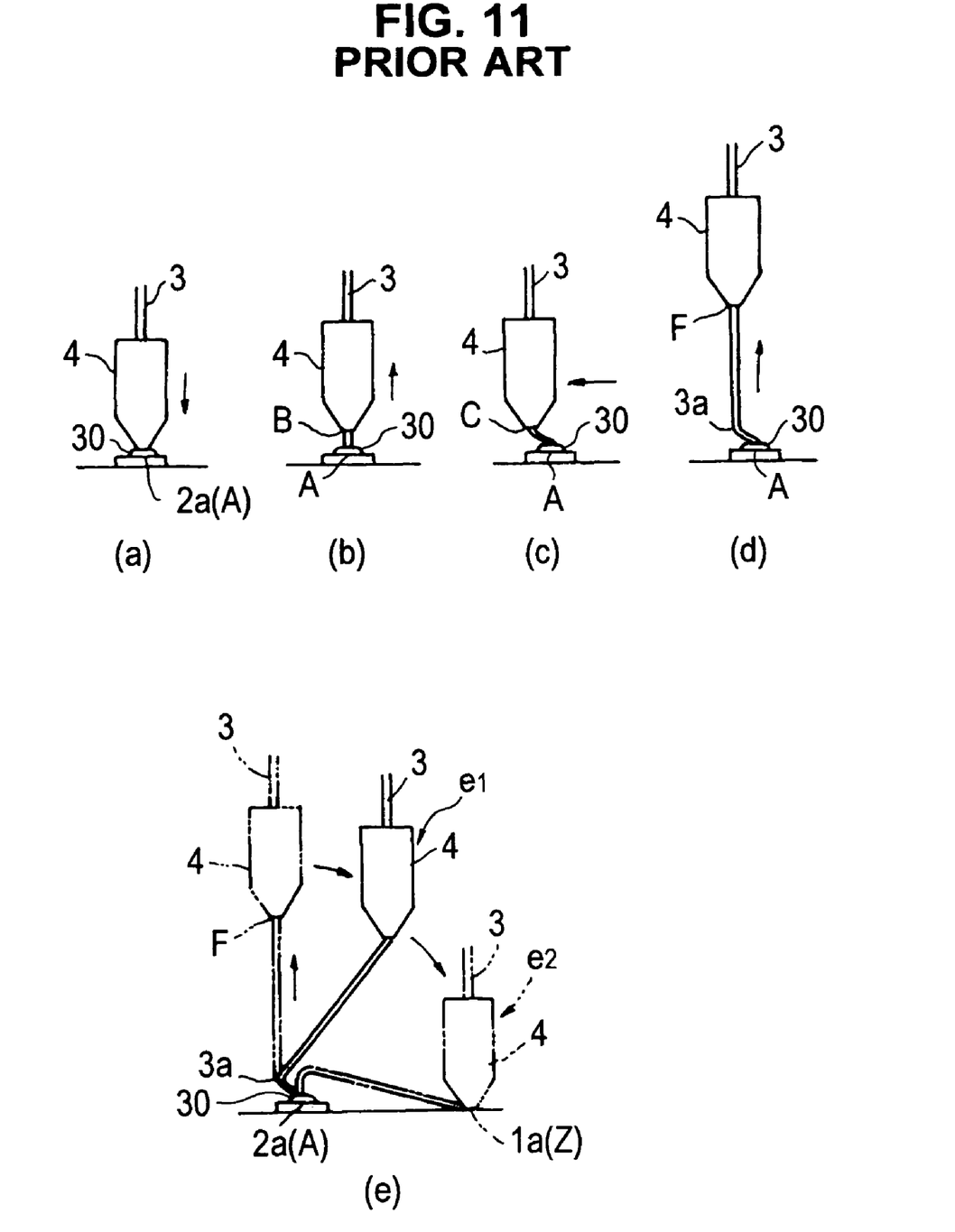
FIG. 11 is a schematic diagram showing wire shapes in respective steps in association with the movement of the capillary to form the wire loop of a triangular shape shown in FIG. 9B.

The wire loop having a triangular shape shown in FIG. 9B is formed by a sequence of steps as shown in FIG. 11. Since the wire loop having a triangular shape is not provided with an upper base portion (L) unlike the wire loop having a trapezoidal shape described above, in forming the wire loop of a triangular shape, the second reverse operation in steps (d) and (e) of FIG. 10 is not conducted. Therefore, in this instance, a step that corresponds to the steps (d), (e) and (f except for $f_1$ and $f_2$) of FIG. 10 is carried out only in step (d) of FIG. 11. More particularly, steps (a), (b) and (c) of FIG. 11 are the same as the steps (a), (b) and (c) of FIG. 10, and after the first reverse operation in step (c) of FIG. 11, the capillary 4 is vertically raised to a point F in step (d) of FIG. 11 while the wire 3 is supplied. Subsequently, in step (e) of FIG. 11, the capillary 4 is moved via positions $e_1$ and $e_2$ in a manner similar to that in step (f) of FIG. 10, with the result that the wire 3 is bonded to the second bonding point Z or the lead 1a.

However, in the above-described techniques, as the wire loop includes the neck portion H having a somewhat large height, the wire loop becomes high and thus is rendered unstable. In addition, in a case where a wire loop is formed without any reverse operation of the capillary in order to make the height of a neck portion H thereof small and the height of the neck portion H is reduced to a certain level or below, the neck portion H is liable to be damaged in drawing or moving the wire 3 to arrange it in place because of the wire 3 vertically extending from the first bonding point A.

Accordingly, various techniques have been proposed in order to solve the above mentioned problems. For example, U.S. Patent Application Publication No. 2004/0104477 or Japanese Patent Laid-Open Publication No. 2004-172477 discloses a wire loop connecting a first bonding point and a second bonding point through a wire, wherein a top portion of a ball bonded to the first bonding point, together with a part of the wire, is crushed.

The wire loop having such a shape can be formed as a wire loop having a low profile which is stable and strong in shape retention. Not only a wire loop having a short wiring distance but also a wire loop having a long wiring distance can be obtained as a stable wire loop having a low profile. In addition, the wire loop thus formed has a strong shape retention which withstands a force or pressure exerted on the wire loop from outside. Therefore, the wire loop has an excellent shock absorbing function against a shock, such as a shock caused by contact of the capillary or emission of an ultrasonic wave during bonding of the wire to the second bonding point, vibration of the wire, an external force generated by flow of a molding material during injection of the molding material and the like, with the result that bending or tilting of the wire and a breakage in the neck portion of the wire loop can be effectively prevented.

However, in the technique disclosed in U.S. Patent Application Publication No. 2004/0104477, since part of the wire and the top of the bonded ball is crushed by the capillary at the first bonding point, there is a possibility that the first bonding point will be damaged. In addition, the wire which has been crushed at the first bonding point may be caused to partly protrude in a direction opposite from the second bonding point. In the case where wiring is finely effected and a direction of the wire loop is slanted with respect to an edge of a semiconductor chip, the protruding part of the wire may come into contact with a wire of the adjacent first bonding point.

SUMMARY OF THE INVENTION

The present invention has been made in view of the foregoing disadvantages of the prior art.

Accordingly, it is an object of the present invention to provide a wire loop having a low profile which is stable and of which a neck portion is hard to damage while no crushed part is formed by a capillary on a wire and a ball bonded to a first bonding point.

It is another object of the present invention to provide a semiconductor device having said wire loop incorporated therein.

It is still another object of the present invention to provide a wire bonding method capable of forming said wire loop.

In accordance with one aspect of the present invention, a wire loop is provided. The wire loop comprises: a wire connecting a first bonding point and a second bonding point therethrough; the wire including a ball bonded to the first bonding point, a neck portion adjacent to the ball and a major portion extending from the neck portion to the second bonding point; wherein the neck portion includes a riser part which extends, from the bonded ball, obliquely upward in a direction toward the second bonding point, and the riser part is formed by a top portion of the ball which has entered an opening of a capillary and been shaped at the time of ball bonding.

In a preferred embodiment of the present invention, the wire includes at least one bend mark formed on the neck portion or the major portion thereof.

In a preferred embodiment of the present invention, the wire includes a bend between the neck portion and the major portion; and a plurality of the bend marks are formed on the bend or in the vicinity of the bend.

In accordance with another aspect of the present invention, a wire bonding method for bonding a wire between a first bonding point and a second bonding point using a capillary is provided. The wire bonding method comprises: bonding a ball formed on a tip end of the wire to the first bonding point; and inclining a riser part of the wire, which extends from the bonded ball, toward the second bonding point, the riser part being formed by a top portion of the ball which has entered an opening of the capillary and which has been shaped at the time of the bonding of the ball to the first bonding point.

In a preferred embodiment of the present invention, the wire bonding method further comprises forming at least one bend on a portion of the wire extending from the riser part thereof by moving the capillary obliquely upward or by moving the capillary upward and then horizontally or by moving the capillary upward and then obliquely downward.

In a preferred embodiment of the present invention, the inclining of the riser part is carried out by moving the capillary obliquely upward and includes forming a bend on the riser part of the wire.

In accordance with still another aspect of the present invention, a wire bonding method for bonding a wire between a first bonding point and a second bonding point using a capillary is provided. The wire bonding method comprises the steps of:

(a) bonding a ball formed on a tip end of the wire to the first bonding point;

(b) moving the capillary obliquely upward in a direction toward the second bonding point, to thereby make a first portion of the wire, which has entered an opening of the capillary at the time of the bonding of the ball to the first bonding point, extend obliquely upward in a direction toward the second bonding point;

(c) subsequently moving the capillary vertically and horizontally while carrying out loop control, to thereby form at least one bend on a second portion of the wire extending from the first portion thereof; and (d) thereafter, moving the capillary horizontally and vertically to the second bonding point while supplying the wire from the capillary and carrying out loop control, and then bonding the wire to the second bonding point.

In a preferred embodiment of the present invention, in the step (b), another bend is formed on the first portion of the wire.

In a preferred embodiment of the present invention, the step (c) is carried out by moving the capillary obliquely upward or by moving the capillary upward and then horizontally or by moving the capillary upward and then obliquely downward.

In a preferred embodiment of the present invention, the step (c) is repeatedly carried out to form a plurality of the bends on the second portion of the wire.

In a preferred embodiment of the present invention, a resultant bend of a large size is formed between the first portion and the second portion of the wire in the step (d), the at least one bend being disposed at such a position on the wire that the at least one bend will be situated, as a bend mark, on the resultant bend or in the vicinity of the resultant bend.

In accordance with a further aspect of the present invention, a semiconductor device is provided. The semiconductor device comprises: a first bonding point; a second bonding point; and a wire bonded to the first bonding point and the second bonding point to connect the first bonding point and the second bonding point therethrough, the wire including a ball bonded to the first bonding point, a neck portion adjacent to the ball and a major portion extending from the neck portion to the second bonding point; wherein the neck portion includes a riser part which extends, from the bonded ball, obliquely upward in a direction toward the second bonding point, and the riser part is formed by a top portion of the ball which has entered an opening of a capillary and been shaped at the time of ball bonding.

According to the present invention, the wire loop is provided on the neck portion thereof with the inclined riser part which is formed by a top portion of the ball which has entered an opening of a capillary and been shaped at the time of ball bonding, so that the wire loop has a low profile which is stable and which is formed without any damage caused to a neck portion thereof. In the preferred embodiment of the invention, the wire of the entire wire loop can be stably bent by forming a plurality of bends at desired locations of the wire by the capillary being moved obliquely upward or by the capillary being moved upward and then horizontally or by the capillary being moved upward and then obliquely downward.

BRIEF DESCRIPTION OF THE DRAWINGS

These and other objects and many of the attendant advantages of the present invention will be readily appreciated as the same becomes better understood by reference to the following detailed description when considered in connection with the accompanying drawings; wherein.

DETAILED DESCRIPTION OF THE INVENTION

Now, a wire loop, a semiconductor device and a wire bonding method according to the present invention will be described hereinafter with reference to the accompanying drawings in which like parts in each of the several figures are identified by the same reference character or numeral.

Figure 1A:
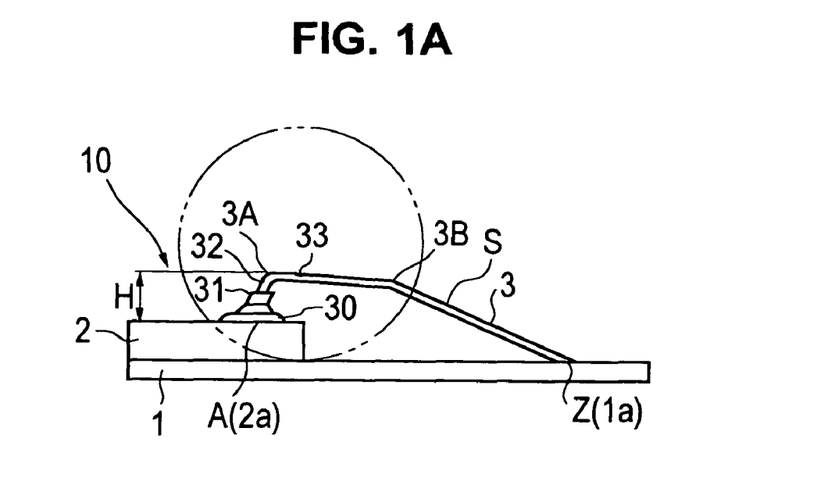
FIG. 1A is an elevational view showing a shape of an embodiment of a wire loop in a semiconductor device according to the present invention.
Figure 1B:
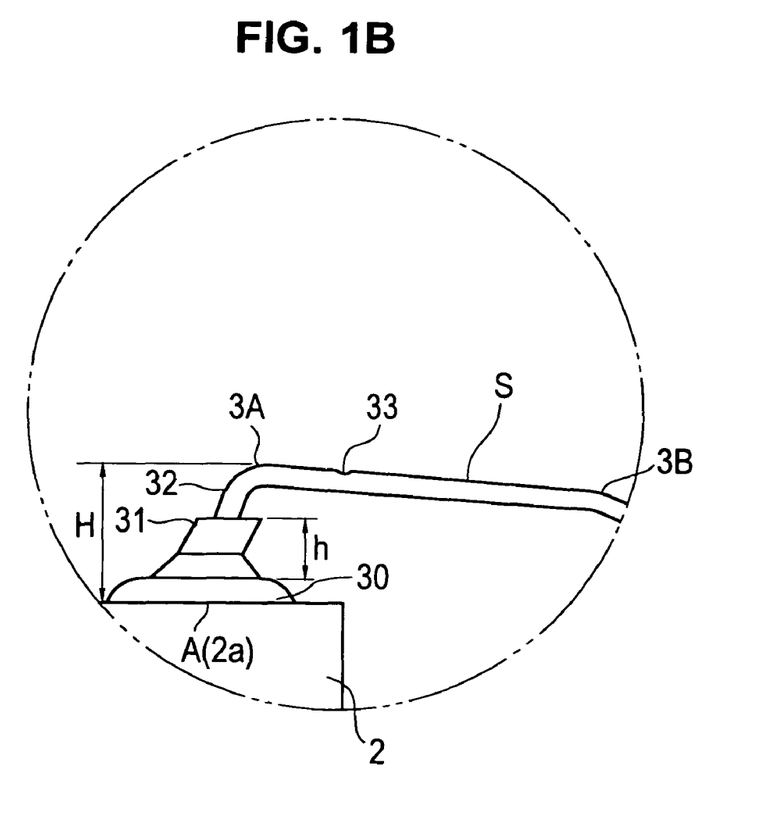
FIG. 1B is an enlarged fragmentary view showing the part encircled by a two-dot chain line in FIG. 1A.
Figure 3:
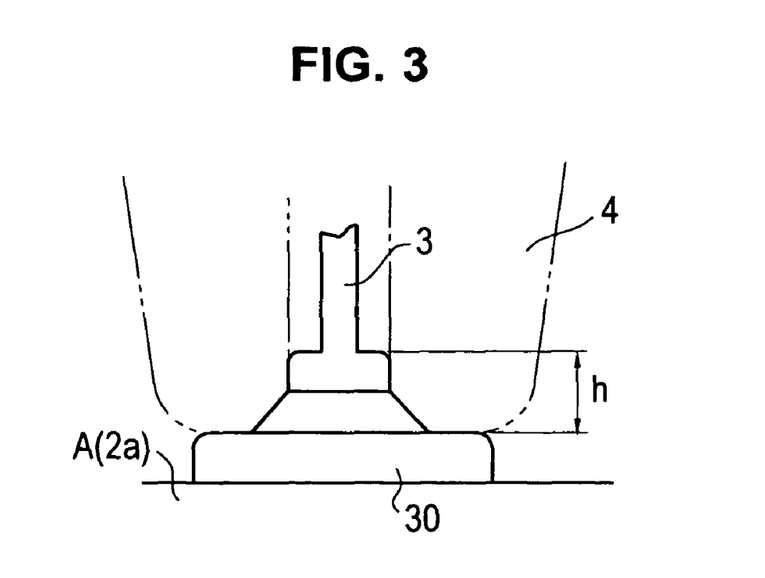
FIG. 3 is an illustrative view showing a riser part being formed by a top portion of a ball which enters an opening of the capillary at the time of ball bonding.

Referring first to FIGS. 1A and 1B, an embodiment of a wire loop and a semiconductor device 10 having the wire loop incorporated therein according to the present invention is illustrated. In the semiconductor device 10, a semiconductor chip 2 is attached to a lead frame 1 and is provided thereon with a pad 2a which is a first bonding point A. The wire loop of a wire 3 is formed to have a substantially triangular shape in general and includes a neck portion H having a ball 30 bonded to the pad 2a or first bonding point A and a major portion or generally inclined portion S which has an end bonded to a lead 1a of the lead frame 1 or a second bonding point Z. The neck portion H and the major portion L are connected through a resultant bend 3A. Such construction of the illustrated embodiment is approximately the same as that of a conventional semiconductor device. However, in the illustrated embodiment, the neck portion H includes a riser part h which extends from the bonded ball 30 obliquely upward in a direction toward the second bonding point Z as shown in FIGS. 1A and 1B wherein a bent upper riser part has a slanted parallelogram cross section. The riser part h of the neck portion H is formed by a top portion of the ball 30 which has entered an opening of a capillary 4 and which has been shaped at the time of bonding the ball 30 onto the first bonding point A as shown in FIG. 3. A cylinder configuration is formed as an upper riser part which is subsequently bent to incline towards a second bonding point Z to have a slanted parallelogram cross section.

As the wire loop is provided in the neck portion H with the riser part h thus inclined toward the second bonding point Z, the neck portion H can be formed to have a reduced height as compared to that of the conventional wire loop of a being damaged. Therefore, the wire loop can be formed to have a low profile, leading to a reduction in thickness of the semiconductor device 10.

Figure 2:
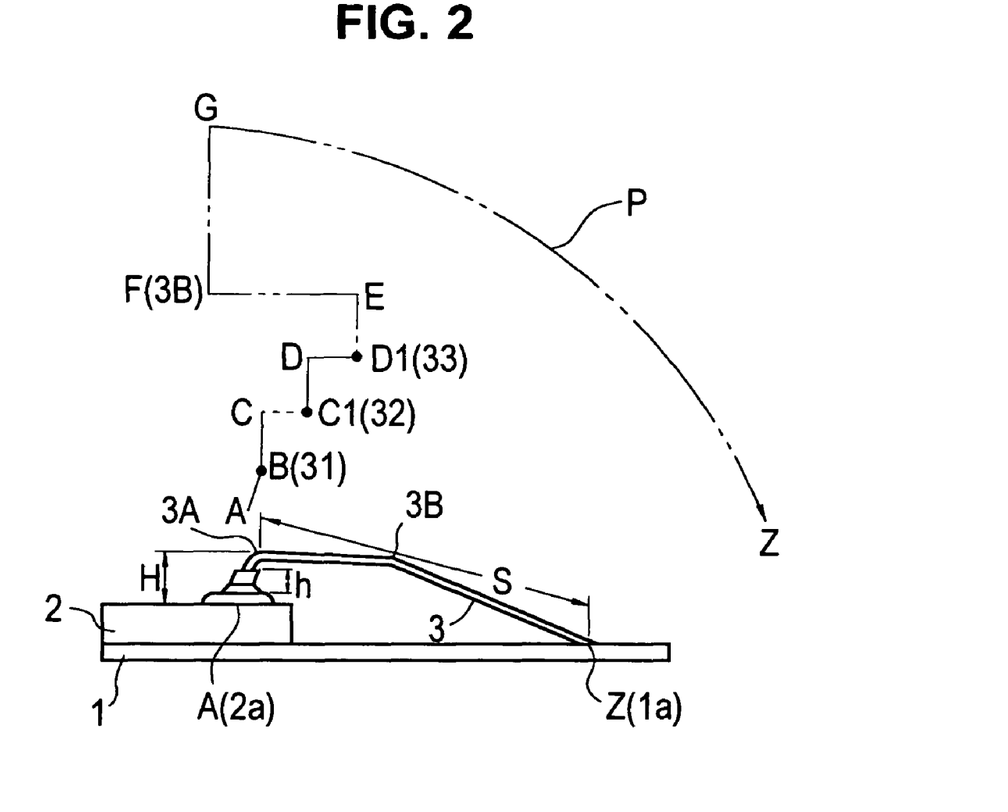
FIG. 2 is a schematic elevational view showing a moving path of a capillary to form the wire loop having a shape shown in FIGS. 1A and 1B.
Figure 4:
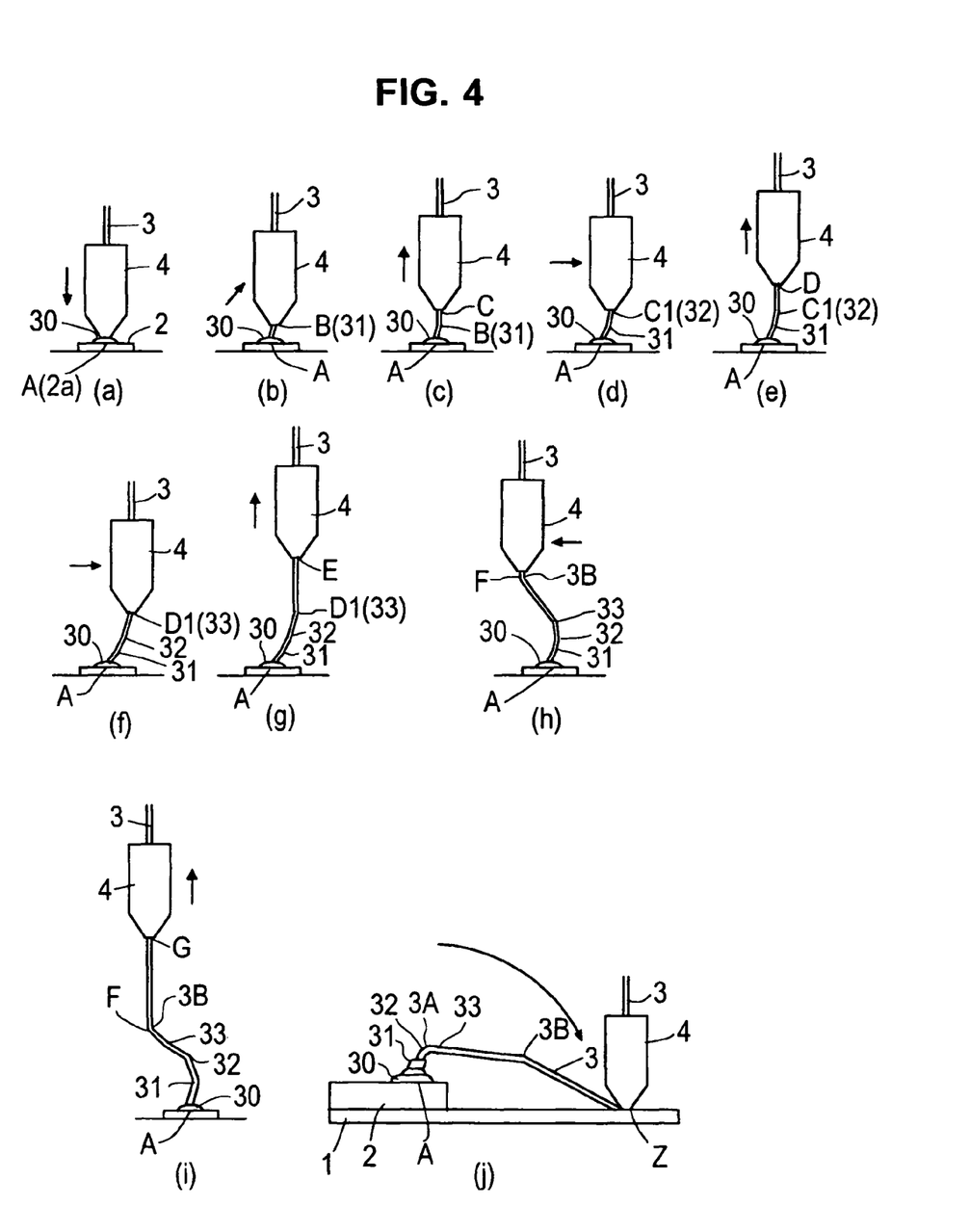
FIG. 4 is a schematic diagram showing wire shapes in respective steps in association with the movement of the capillary according to a method of the present invention by way of example.

Referring now to FIGS. 2 and 4, an embodiment of the wire bonding method according to the present invention by which the semiconductor device 10 shown in FIGS. 1A and 1B is obtained will be described. FIG. 2 shows a moving path P of a capillary 4 and a finished state of the wire loop connected to the first and second bonding points A and Z by wire bonding.

First, in step (a) of FIG. 4, the capillary 4 is lowered while a clamp (not shown), which is used for clamping a wire 3 and releasing the same, is opened, so that a ball 30 formed on a tip end of the wire 3 is bonded to the first bonding point A with an enlarged base. At this time, a top portion of the ball 30 enters an opening of the capillary 4 and is deformed by the opening of the capillary 4. The thus deformed portion of the ball 30 forms a riser part to be larger than the wire diameter at a neck portion H of the wire loop. Then, in step (b) of FIG. 4, the capillary 4 is moved obliquely upward to a point B while the wire 3 is supplied, so that the riser part h is inclined toward the second bonding point Z and a bend 31 is formed in the riser part h. Thereafter, in step (c) of FIG. 4, the capillary 4 is vertically raised to a point C which may be selected as desired while the wire 3 is supplied.

Subsequently, in step (d) of FIG. 4, the capillary 4 is horizontally moved in a direction toward the second bonding point Z to a point C1. As a result, a portion of the wire 3 between the bend 31 and the point C1 is formed to be inclined and a bend 32 is formed at a top of this portion of the wire 3. Then, in step (e) of FIG. 4, the capillary 4 is vertically raised to a point D which may be selected as desired while the wire 3 is further supplied.

Thereafter, in step (f) of FIG. 4, the capillary 4 is horizontally moved to a point D1 in a direction toward the second bonding point Z. As a result, a portion of the wire 3 between the bend 32 and the point D1 is formed to be inclined and a bend 33 is formed at a top of this inclined portion of the wire 3. Then, in step (g) of FIG. 4, the capillary 4 is vertically raised to a point E which may be selected as desired while the wire 3 is supplied.

Next, in step (h) of FIG. 4, a reverse operation of the capillary 4 is carried out, i.e. the capillary 4 is substantially horizontally moved in a direction opposite from the second bonding point Z to a point F. The movement of the capillary 4 from the point E to the point F forms a bend 3B in the wire 3. Thereafter, in step (i) of FIG. 4, the capillary 4 is vertically raised to a point G which may be selected as desired while the wire 3 is delivered. Thus, the wire 3 having a length corresponding to the inclined major portion S of the wire loop shown in FIG. 2 has been supplied from the capillary 4.

Subsequently, step (j) of FIG. 4 is conducted in the same manner as that in the conventional method described above such that the capillary 4 is lowered to be located at the second bonding point Z, resulting in the wire 3 being bonded to the second bonding point Z.

Figure 5A:
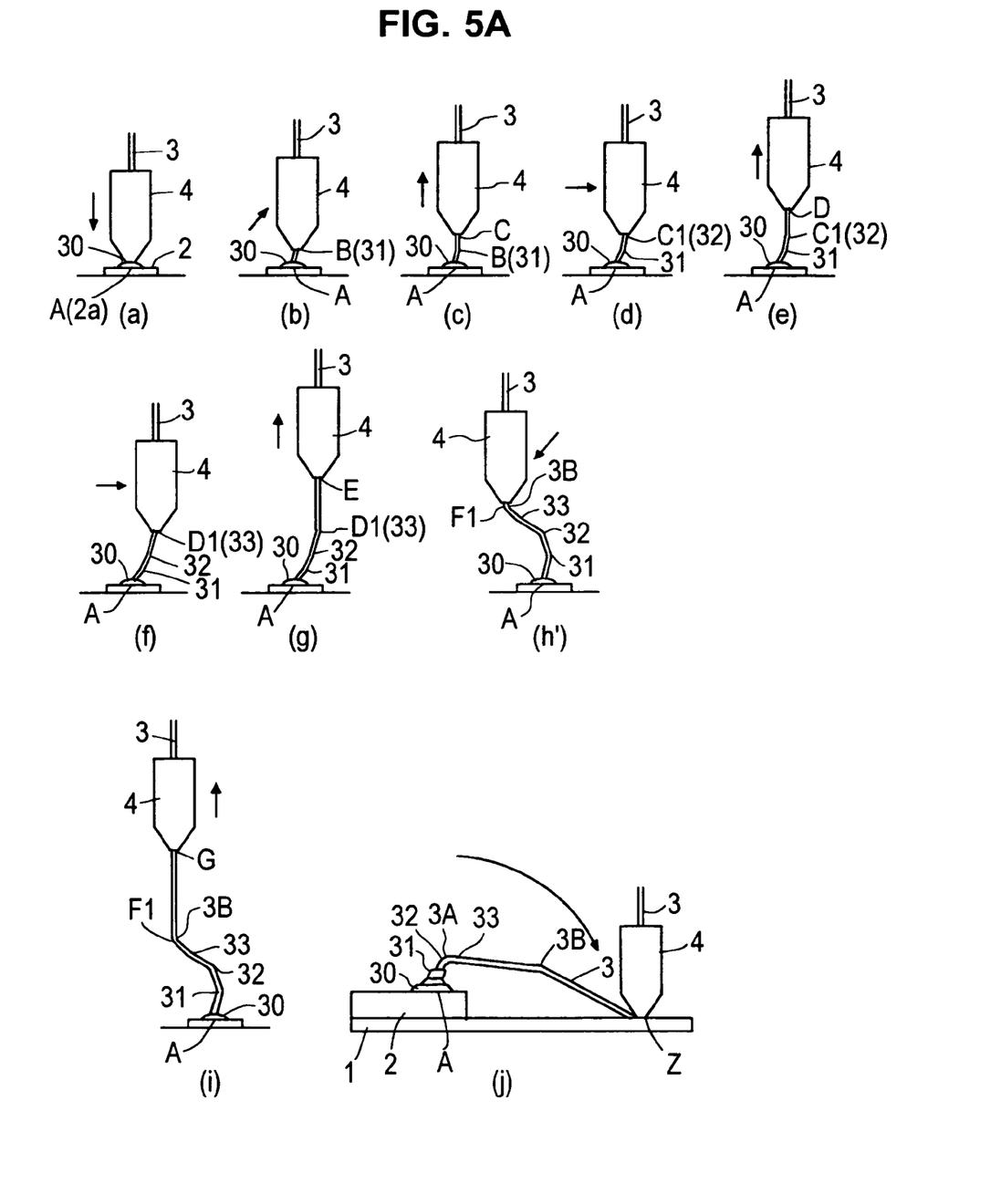
FIG. 5A is a schematic diagram showing wire shapes in respective steps in association with the movement of the capillary according to a modification of the method shown in FIG. 4.
Figure 5B:
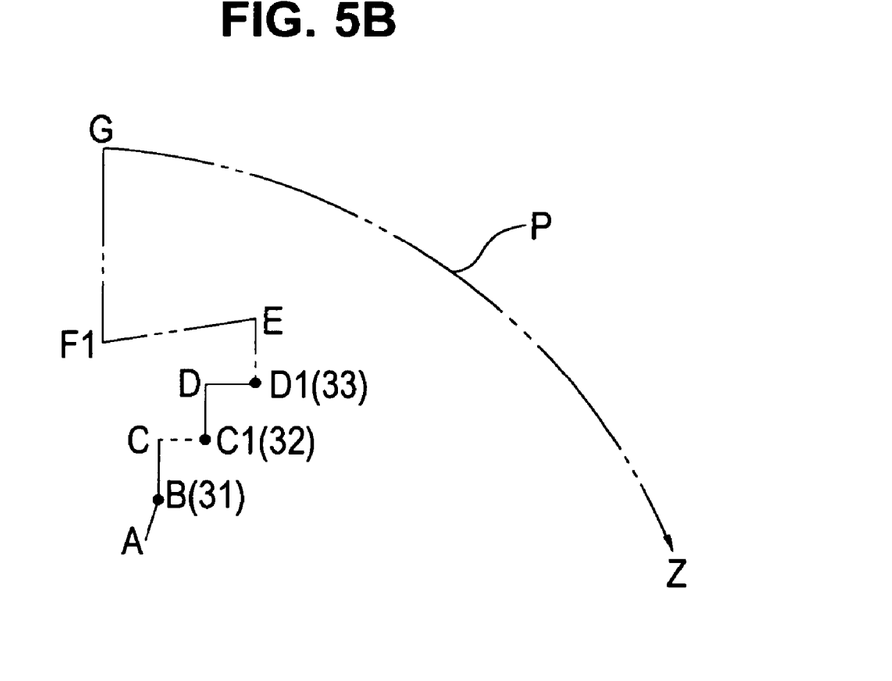
FIG. 5B is a schematic elevational view showing a moving path of the capillary to form the wire loop according to the steps of FIG. 5A.

In step (h) of FIG. 4, the reverse operation of the capillary 4 is conducted to form the bend 3B in the wire 3. Instead, the capillary 4 may be obliquely lowered to a point F1 as in step (h') shown in FIG. 5A, to thereby form the bend 3B in the wire 3. Then, the capillary 4 is moved in the same manner as in steps (i) and (j) of FIG. 4, resulting in the wire loop being provided. In this case, the capillary 4 is moved along a moving path P shown in FIG. 5B to form the wire loop.

Figure 6A:
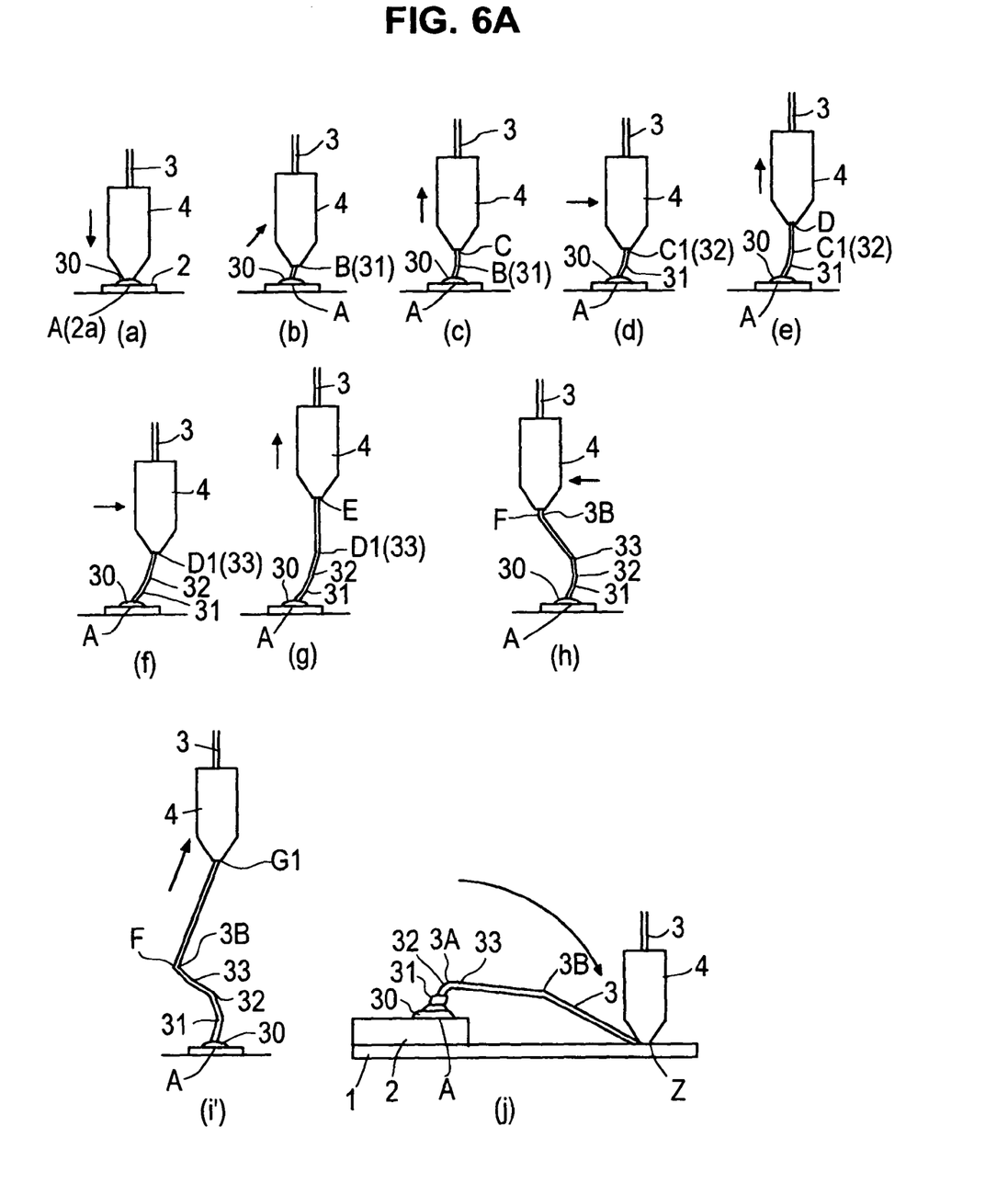
FIG. 6A is a schematic diagram showing wire shapes in respective steps in association with the movement of the capillary according to another modification of the method shown in FIG. 4.
Figure 6B:
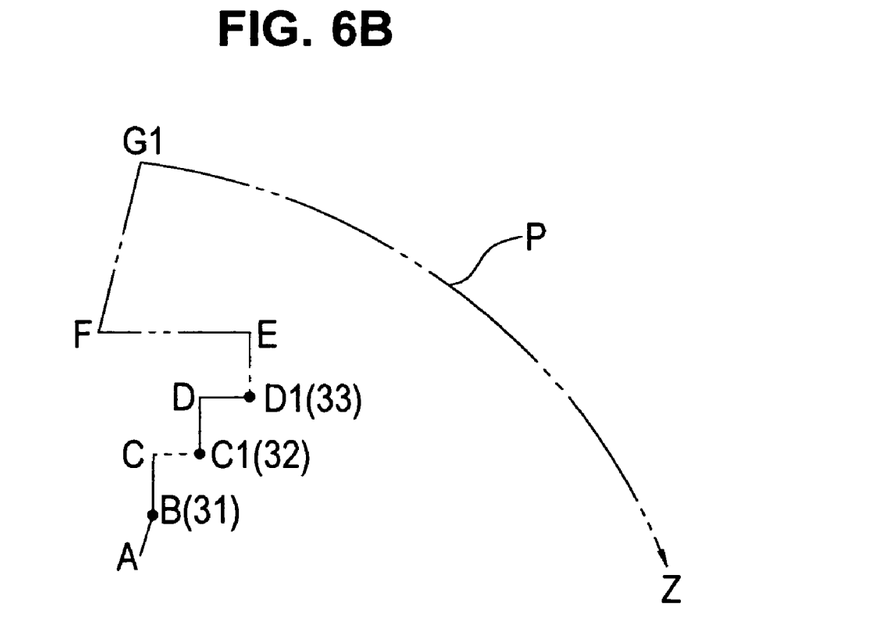
FIG. 6B is a schematic elevational view showing a moving path of the capillary to form the wire loop according to the steps of FIG. 6A.

In step (i) of FIG. 4, the capillary 4 is vertically raised to the point G as described above. Instead, the capillary may be obliquely raised to a point G1 while supplying the wire 3 as in step (i') shown in FIG. 6A, and then the capillary 4 is lowered to the second bonding point Z to bond the wire 3 thereto in the same way as in step (j) of FIG. 4. In this instance, the capillary 4 is moved along a moving path P shown in FIG. 6B to form the wire loop.

Incidentally, it is preferable that the capillary 4 be constructed to be movable within a range of 0 to 500 μm and in directions over 360 degrees defined on the basis of a line interconnecting the first bonding point A and second bonding point Z. In addition, each of the bends 31, 32, 33 and 3B may be formed by moving the capillary 4 obliquely upward or by moving the capillary upward and then horizontally or by moving the capillary 4 upward and then obliquely downward.

As described above, the obliquely upward movement of the capillary 4 in step (b) of FIG. 4 makes the riser part h adjacent to the top of the bonded ball 30 incline, whereby the wire loop having a low profile in which the neck portion H is kept at a reduced height can be provided. In addition, since a plurality of the bends 31, 32 and 33 are formed at locations on the resultant bend 3A connecting the neck portion H and the major portion S of the wire loop or in the vicinity of the resultant bend 3A, the wire loop of a low profile can be formed without causing any damage to the riser part h or the neck portion H as well as with no crushed mark being left on the wire and/or the bonded ball at the first bonding point A by the capillary 4. In the finished wire loop, the bends 31, 32 and 33 are each left as a bend mark of a reduced dimension on the wire 3.

It has been found by the experiments that the height of the neck portion H needed to prevent damage to the neck portion H is 120 to 130 μm in the conventional wire loop of a triangular shape shown in FIG. 9B while the needed height of the neck portion H is 65 to 70 μm in the wire loop according to the embodiment of the present invention described above. Incidentally, in the case of the wire loop in which a crushed mark or part is formed on the wire and bonded ball at the first bonding point by the capillary according to the technique shown in U.S. Patent Application Publication No. 2004/0104477, it is possible for the height of the neck portion to be rendered 50 μm or less.

Figure 7A:
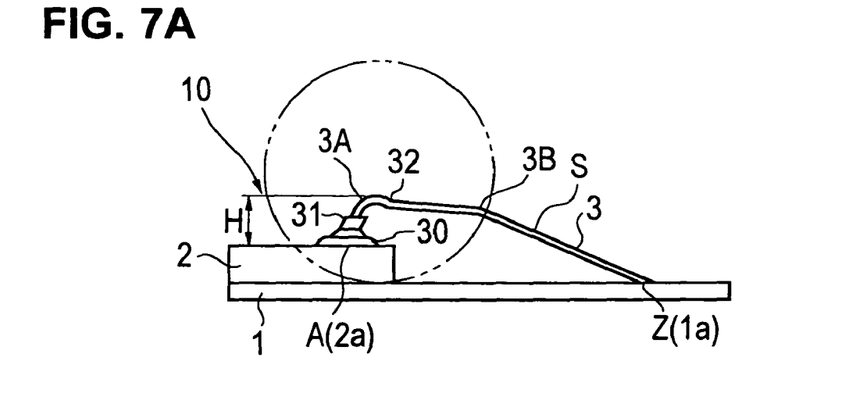
FIG. 7A is an elevational view showing a shape of another embodiment of a wire loop in a semiconductor device according to the present invention.
Figure 7B:
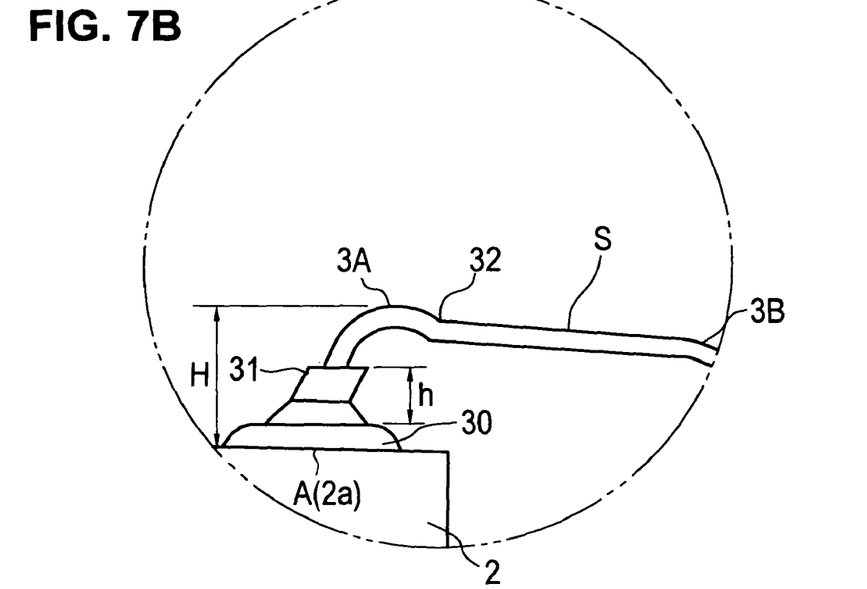
FIG. 7B is an enlarged fragmentary view showing the part encircled by a two-dot chain line in FIG. 7A.

In the embodiment described above, operations of forming the bends 31, 32 and 33 are carried out three times in step (b), steps (c) to (d), and steps (e) to (f) of FIG. 4, respectively. Such forming operations may be repeated a plurality of times less than or more than three times so as to form a plurality of bends at locations in the wire as desired. For example, as shown in FIGS. 7A and 7B, two of the bends 31 and 32 are formed in the wire 3 on the resultant bend 3A connecting the neck portion H and the major portion S or in the vicinity of the resultant bend 3A. In this case, the operations conducted in steps (c) and (d) of FIG. 4 are omitted.

In this way, the wire is stably bent at a plurality of locations. As a result, the riser part of the wire loop can be formed to have a strength greater than that of the conventional wire loop of a low profile, so that the wire loop which is positionally stable and which has a strong shape retention can be formed.

Figure 8:
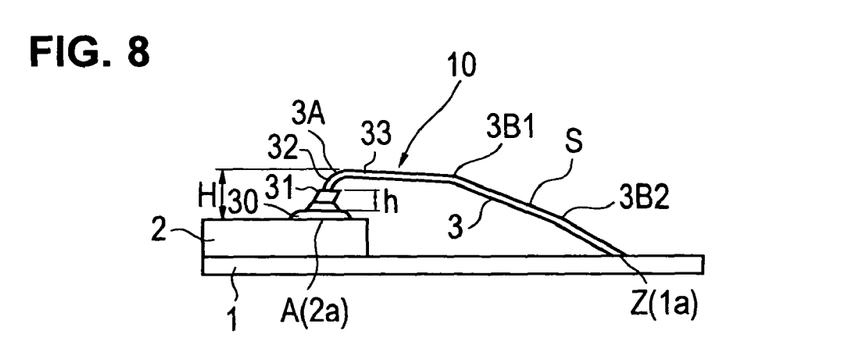
FIG. 8 is an elevational view showing a shape of still another embodiment of a wire loop in a semiconductor device according to the present invention.

The bend 3B formed on the inclined major portion S of the wire 3 is arranged so as to prevent the major portion S from upwardly expanding at the time of bonding the wire 3 onto the second bonding point Z. In the embodiments described above, the major portion S of the wire 3 is provided at an intermediate position thereof with only one bend 3B. However, a plurality of such bends may be provided at an intermediate position or positions of the inclined major portion S of the wire 3 and/or at a position near the second bonding point Z. In an embodiment of the wire loop shown in FIG. 8, two such bends 3B1 and 3B2 are provided on the inclined major portion S of the wire 3.

As can been seen from the foregoing, in the wire bonding method according to the present invention, the wire loop connecting the first bonding point and the second bonding point therethrough is provided on the neck portion thereof with the inclined riser part, to thereby reduce the height of the neck portion and provide the riser part with an increased strength as compared to the conventional wire loop of a low profile. Such construction can provide a wire loop having a low profile which is stable and which is formed without any damage caused to a neck portion thereof.

While preferred embodiments of the invention have been described with a certain degree of particularly with reference to the drawings, obvious modifications and variations are possible in light of the above teachings. It is therefore to be understood that within the scope of the appended claims, the invention may be practiced otherwise than as specifically described.

What is claimed is:

1. A wire bonding method for bonding a wire between a first bonding point and a second laterally offset bonding point using a capillary, comprising:

bonding a ball formed on a tip end of the wire to form an enlarged lower base at said first bonding point and an upper riser part having a smaller diameter than the lower base; and immediately bending the upper riser part of the wire, after the bonding, to extend all sides of the upper riser part obliquely upward and away from a vertical center line of the bonded ball, to incline toward said second laterally offset bonding point, said upper riser part being formed by a top portion of the ball which has entered an opening of said capillary and which has been shaped at the time of the bonding of said ball to said first bonding point, the upper riser part being larger than the wire diameter and inclined from the vertical center line of the enlarged base when the capillary is moved obliquely upward and away from the bonded ball wherein the upper riser part is bent to have a slanted parallelogram cross section.

2. The wire bonding method as defined in claim 1, further comprising forming at least one bend on a portion of the wire extending from said riser part thereof by moving said capillary obliquely upward or by moving said capillary upward and then horizontally or by moving said capillary upward and then obliquely downward.

3. The wire bonding method as defined in claim 2, wherein when the inclining of said riser part is carried out by moving said capillary obliquely upward and further includes forming a bend on said riser part of the wire.

4. A wire bonding method for bonding a wire between a first bonding point and a second bonding point laterally offset from the first bonding point using a capillary, comprising the steps of:

(a) bonding a ball formed on a tip end of the wire to said first bonding point while forming from the ball an enlarged lower base and an upper riser part connected to the enlarged lower base;

(b) moving said capillary obliquely upward in a direction offset from a vertical center line of the ball toward said second bonding point, to thereby make a first riser portion of the wire, which has entered an opening of said capillary at the time of the bonding of said ball to said first bonding point, extend obliquely upward and laterally offset from the vertical center line of the enlarged lower base in a direction toward said second bonding point;

(c) subsequently moving said capillary vertically and horizontally while carrying out loop control, to thereby form at least one bend indentation on a second portion of the wire extending from the first riser portion thereof; and (d) thereafter, moving said capillary horizontally and vertically to said second bonding point while supplying the wire from said capillary and carrying out loop control, and then bonding the wire to said second bonding point, wherein the bend indentation is positioned on a straight length of the wire.

5. The wire bonding method as defined in claim 4, wherein in the step (b), another bend is formed on said first riser portion of the wire.

6. The wire bonding method as defined in claim 4, wherein the step (c) is carried out by moving said capillary obliquely upward or by moving said capillary upward and then horizontally or by moving said capillary upward and then obliquely downward.

7. The wire bonding method as defined in claim 6, wherein the step (c) is repeatedly carried out to form a plurality of the bends on said second portion of the wire.

8. The wire bonding method as defined in claim 6, wherein a resultant bend of a large size is formed between said first riser portion and said second portion of the wire in the step (d), said at least one bend being disposed at such a position on the wire that said at least one bend will be situated, as a bend mark, on said resultant bend or in the vicinity of said resultant bend.

9. A wire bonding method for bonding a wire between a first bonding point on a semiconductor chip and a second bonding point laterally offset from the first bonding point with a movable capillary to create a low wire height profile comprising the steps of;

bonding a first end of the wire on the semiconductor chip with the movable capillary to form an enlarged base and a riser part larger than a diameter of the wire connected to the enlarged base;

immediately following the bonding, forming an inclined riser part of the wire relative to a center line of the enlarged base to be larger than a diameter of the wire, the riser part is inclined on all sides toward the second bonding point and offset from a center line of the enlarged base as the capillary is moved obliquely upward away from the bonded wire end on the semiconductor chip;

moving the capillary vertically upward to form a first bend in the wire;

moving the capillary horizontally in a first direction adjacent the first bend to form a second bend in the wire;

moving the capillary vertically upward from the second bend to a first predetermined position;

moving the capillary horizontally in the first direction to form a third bend adjacent the second bend;

moving the capillary vertically upward from the third bend to a second predetermined position;

moving the capillary horizontally in a second direction, opposite the first direction, to form a fourth bend;

moving the capillary vertically upward from the fourth bend to a third predetermined position; and moving the capillary horizontally in the first direction and vertically downward to bond a second end of the wire whereby a low profile first bend is created adjacent the first bonding point, a second bent indentation of the wire is provided in a first straight length of wire from the low profile first bend to the fourth bend and a second straight length of wire extends from the fourth bend to the second bonding point of the second end of the wire wherein the upper riser part is bent to have a slanted parallelogram cross section.

10. The wire bonding method of claim 9 wherein the first bend has a maximum vertical height of approximately 65 to 70 μm above the semiconductor chip.

11. The wire bonding method as defined in claim 1 wherein the upper riser part is formed in a cylinder configuration.

12. The wire bonding method as defined in claim 9 wherein the upper riser part is formed in a cylinder configuration.

* * * * *